(12) United States Patent
Zuniga et al.

(10) Patent No.: US 10,715,136 B2
(45) Date of Patent: Jul. 14, 2020

(54) CURRENT SENSE DEVICES AND ASSOCIATED METHODS

(71) Applicant: Maxim Integrated Products, Inc., San Jose, CA (US)

(72) Inventors: Marco A. Zuniga, Berkeley, CA (US); Michael David McJimsey, Danville, CA (US); Brett A. Miwa, Wellesley, MA (US); Chi-Teh Chiang, San Jose, CA (US); Ilija Jergovic, Palo Alto, CA (US); Urs Harald Mader, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 16/280,161

(22) Filed: Feb. 20, 2019

(65) Prior Publication Data

US 2019/0260376 A1 Aug. 22, 2019

Related U.S. Application Data

(60) Provisional application No. 62/632,786, filed on Feb. 20, 2018.

(51) Int. Cl.
*H03K 17/687* (2006.01)
*G01R 19/00* (2006.01)
*H03K 17/082* (2006.01)
*H03K 17/12* (2006.01)

(52) U.S. Cl.
CPC ....... *H03K 17/687* (2013.01); *G01R 19/0092* (2013.01); *H03K 17/0822* (2013.01); *H03K 17/122* (2013.01); *H03K 2217/0027* (2013.01)

(58) Field of Classification Search
CPC .. H03K 17/687; H03K 17/081; H03K 17/122; H03K 17/14; H03K 5/08; H03K 17/06; H03K 17/161
USPC ................... 327/108, 109, 110, 111, 112
See application file for complete search history.

(56) References Cited

U.S. PATENT DOCUMENTS

| 5,272,392 A | * | 12/1993 | Wong | H03K 17/063 327/109 |
| 5,867,014 A | * | 2/1999 | Wrathall | G01R 19/0092 323/315 |
| 8,754,635 B2 | * | 6/2014 | Bogner | G01R 19/0092 323/312 |
| 2010/0102845 A1 | * | 4/2010 | Kadow | H03K 17/0822 324/762.09 |

FOREIGN PATENT DOCUMENTS

EP 0789458 A1 8/1997

* cited by examiner

*Primary Examiner* — John W Poos
(74) *Attorney, Agent, or Firm* — Lathrop GPM LLP

(57) ABSTRACT

A current sense device includes a reference transistor for electrically coupling to a power transistor, a sense transistor for electrically coupling to the power transistor, and control circuitry. The control circuitry is configured to (a) control current through the sense transistor such that a voltage at the sense transistor has a predetermined relationship to a voltage at the power transistor, and (b) control current through the sense transistor according to one or more operating conditions at the reference transistor, to compensate for aging of the power transistor.

18 Claims, 7 Drawing Sheets

CURRENT SENSE DEVICES AND ASSOCIATED METHODS

RELATED APPLICATIONS

This Application claims benefit of priority to U.S. Provisional Patent Application Ser. No. 62/632,786, filed on Feb. 20, 2018, which is incorporated herein by reference.

BACKGROUND

A current sense device senses magnitude of electrical current in an electrical circuit. Current sense devices are used in a wide variety of applications. For example, current sense devices are commonly used to determine current magnitude in power management applications, such as for over-current protection, current-mode control, power monitoring, and/or load-dependent voltage positioning.

Many current sense devices include a discrete current sense resistor, where current through the resistor generates a voltage proportional to magnitude of current through the resistor. The resistor voltage is measured to determine magnitude of current through the resistor. Although these current sense devices are relatively inexpensive, significant power can be dissipated in the current sense resistor, causing power loss and associated heat generation. Consequently, current sense devices including a discrete current sense resistor are not well suited for applications requiring high efficiency or for applications where heat generation is objectionable.

Some other current sense devices rely on parasitic resistance of an electrical circuit component to sense current magnitude. For example, some switching power converters use parasitic resistance of an inductor as a current sense element, where voltage drop across the parasitic resistance is measured to determine magnitude of current through the inductor. Although these current sense devices do not dissipate significant power, they are typically incapable of precisely sensing current magnitude due to variations in the parasitic resistance. For instance, parasitic resistance of an inductor may vary significantly among inductor samples, and the parasitic resistance may also vary significantly with inductor temperature.

Many power management applications include one or more transistors. For example, switching power converters typically include one or more transistors which repeatedly switch between their conductive and non-conductive states. Non-dissipative current sense devices have been developed to measure current through these transistors. For example, FIG. 1 illustrates a prior art current sense device 100 configured to determine magnitude of current $I_L$ through power transistor 102. Current sense device 100 includes a sense transistor 104, a differential amplifier 106, and a transconductance device 108. A drain (D) of sense transistor 104 is electrically coupled to a drain (D) of power transistor 102, and a source (S) of sense transistor 104 is electrically coupled to transconductance device 108 at a node $V_y$. Inverting and non-inverting inputs of differential amplifier 106 are electrically coupled to nodes $V_y$ and $V_x$, respectively, and a source (S) of power transistor device 102 is electrically coupled to node $V_x$. Differential amplifier 106 drives transconductance device 108 to generate current $I_o$ through sense transistor 104 such that voltage at node $V_y$ is equal to voltage at node $V_x$. It can be determined that current $I_L$ is related to current $I_o$ as follows, where $R_p$ is on-resistance of power transistor 102 and $R_s$ is on-resistance of sense transistor 104:

$$I_L = I_o R_s / R_p \qquad \text{(EQN. 1)}$$

Gate length, channel doping, and gate oxide thickness of sense transistor 104 matches that of power transistor 102 so that sense transistor 104 has a similar threshold voltage and current density to power transistor 102. Sense transistor 104 has an on-resistance that is known multiple of an on-resistance of power transistor 102. Consequently, a ratio of $R_s$ to $R_p$ is known, and current $I_L$ can be determined from current $I_o$ using EQN. 1 above.

DETAILED DESCRIPTION OF THE EMBODIMENTS

Figure 1:
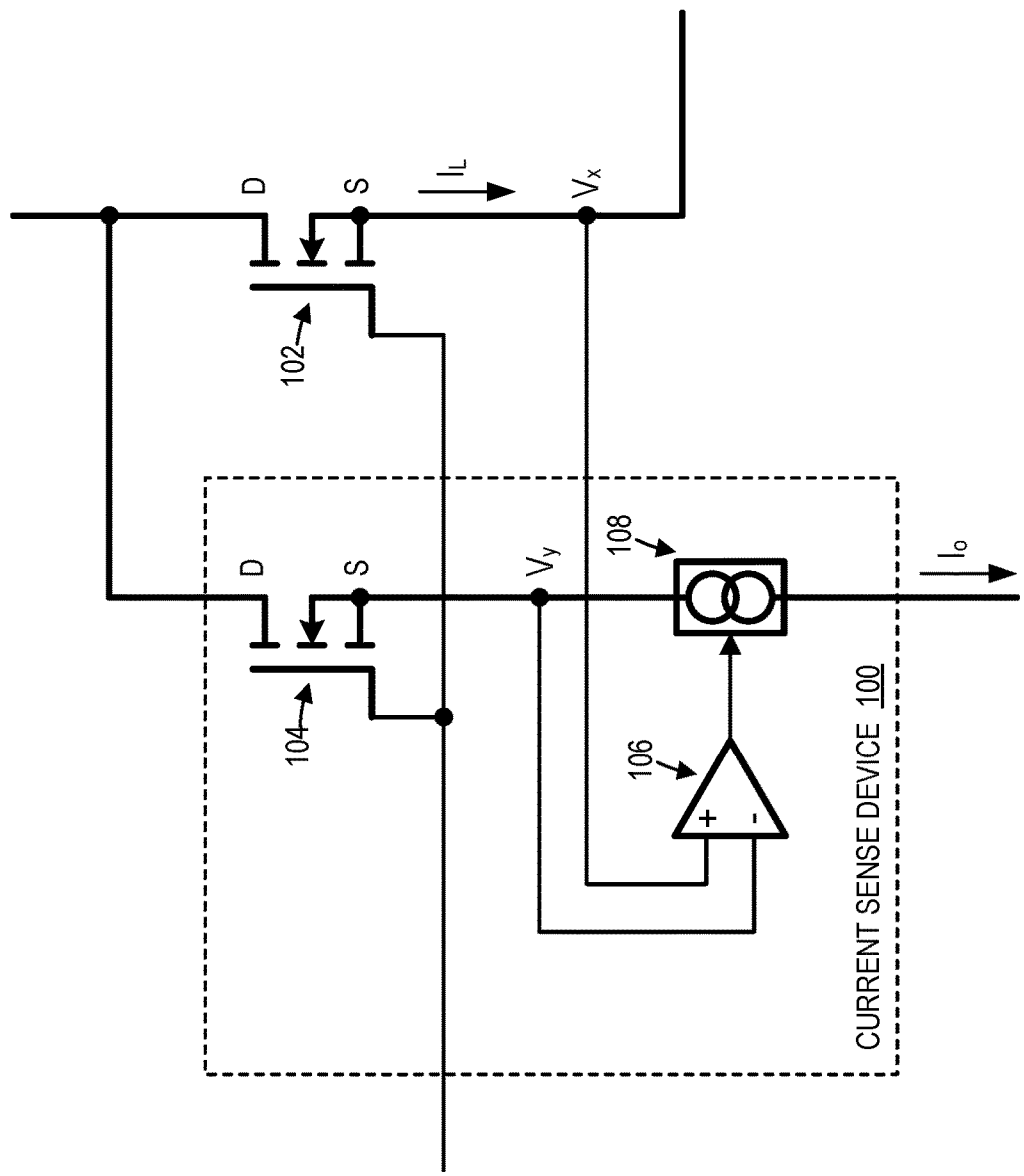
FIG. 1 illustrates a prior art non-dissipative current sense device.

Applicant has determined that accuracy of conventional non-dissipative current sense devices, such as that of FIG. 1, may become degraded over time due to mismatch between the power transistor and the sense transistor. In particular, the power transistor is subjected to significant stress during operation, such as due to hot carrier injection (HCI) effects and transient voltage spikes, which can drive the power transistor momentarily into breakdown (BV). This stress causes the power transistor's electrical characteristics, such as the transistor's on-resistance, to change over time. For example, device-level HCI characterization has shown that transistor triode current, which affects transistor on-resistance, may shift by 10 to 20% over the transistor's lifetime due to HCI effects. Additionally, simulations have shown that transistor triode current may initially shift by approximately 20% in response to high-current switching, followed by a slower shift that is similar to that caused by HCI effects. Consequently, a relationship between respective on-resistance values of the power transistor and the sense transistor will typically vary as the power transistor ages, thereby degrading current magnitude sensing accuracy.

Applicant has developed current sense devices and associated methods to mitigate the problems discussed above. These new current sensing devices include a reference transistor in addition to a sense transistor. The reference transistor is subjected to an operating voltage stress which is intended to match that of the power transistor, such that the reference transistor ages in a manner analogous to that of the power transistor. Current through a sense transistor is calibrated according to one or more operating conditions at the reference transistor, such as according to voltage at the reference transistor and/or current through the reference transistor, to compensate for aging of the power transistor. Consequently, certain embodiments of these new current sense devices can accurately sense magnitude of power transistor current even as the power transistor ages.

Figure 2:
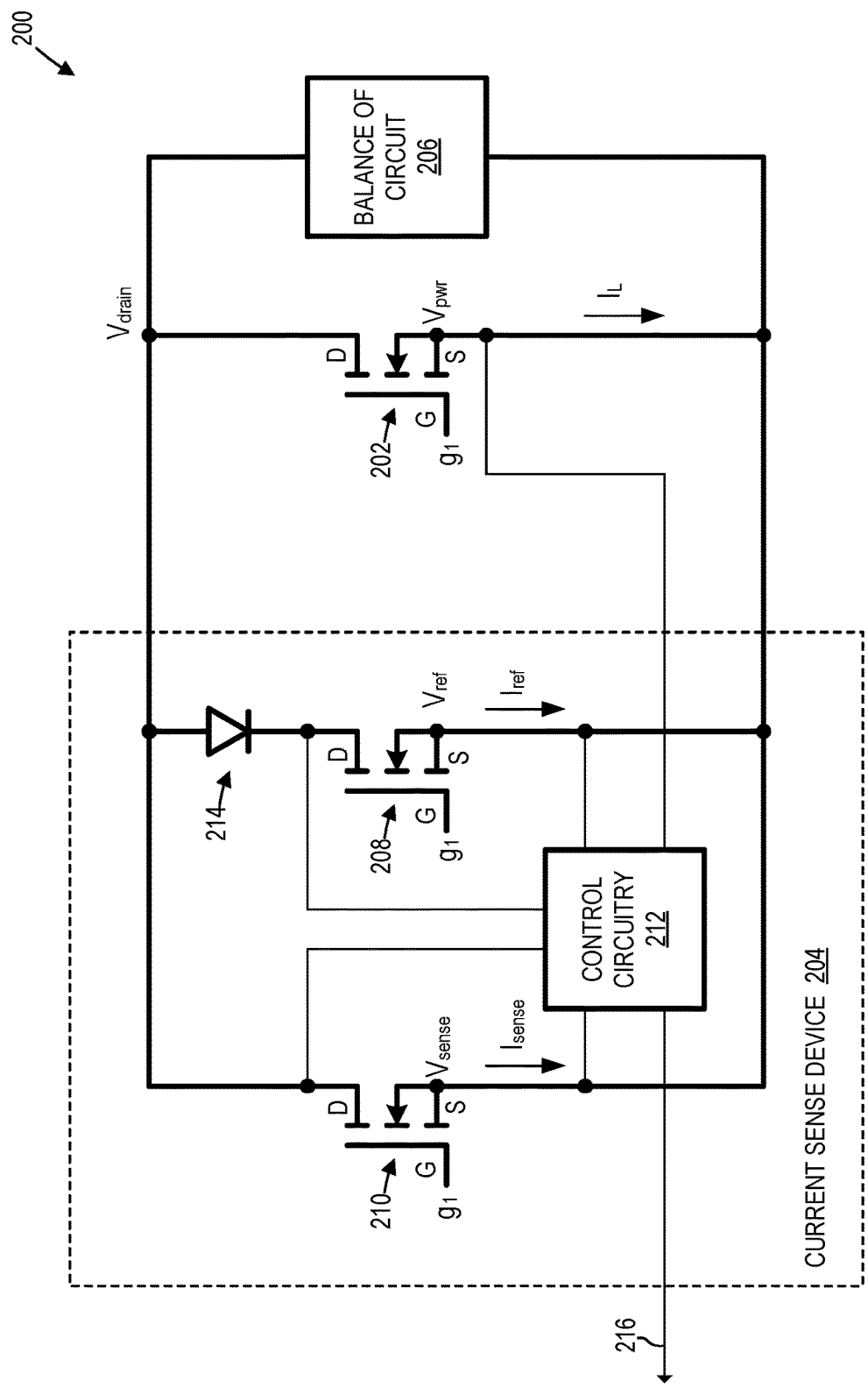
FIG. 2 illustrates an electrical circuit including a current sense device capable of compensating for power transistor aging, according to an embodiment.

FIG. 2 illustrates an electrical circuit 200 including a power transistor 202 and a current sense device 204. Current sense device 204 is one embodiment of the new current sense devices developed by Applicant. Power transistor 202 is electrically coupled to current sense device 204 and to a balance of circuit 206. Balance of circuit 206 symbolically represents a portion of electrical circuit 200 in addition to power transistor 202 and current sense device 204, and balance of circuit 206 may vary depending on the configuration of electrical circuit 200. For example, in embodiments where electrical circuit 200 is part of a switching power converter, balance of circuit 206 may include switching power converter components, such as an inductor, a capacitor, and/or one or more additional transistors, as well as an electrical power source and a load. As another example, in embodiments where electrical circuit 200 is part of a battery management device, balance of circuit 206 may include an electrical power source and one or more batteries.

Current sense device 204 includes a reference transistor 208, a sense transistor 210, control circuitry 212, and a diode device 214. Each of power, reference, and sense transistors 202, 208, 210, has a respective gate G, drain D, and source S. An on-resistance $R_{sense}$ of sense transistor 210 has a predetermined relationship with an on-resistance $R_{pwr}$ of power transistor 202, and an on-resistance $R_{sense}$ of sense transistor 210 has a predetermined relationship with an on-resistance $R_{ref}$ of reference transistor 208. Consequently, a ratio of $R_{sense}$ to $R_{pwr}$ is known, and a ratio of $R_{sense}$ to $R_{ref}$ is also known.

Reference transistor 208 is electrically coupled in parallel with power transistor 202 via diode device 214, i.e., drain D of reference transistor 208 is electrically coupled to drain D of power transistor 202 via diode device 214, and source S of reference transistor 208 is electrically coupled to source S of power transistor 202. In some embodiments, diode device 214 is a single diode, as illustrated. In some other embodiments, diode device 214 includes multiple diodes and/or one or more transistors configured to provide connectivity. Diode device 214 could alternately be electrically coupled between source S of reference transistor 208 and source S of power transistor 202.

Sense transistor 210 is also electrically coupled to power transistor 202. i.e., drain D of sense transistor 210 is electrically coupled to drain D of power transistor 202, and source S of sense transistor 210 is electrically coupled to source S of power transistor 202. Respective gates G of each of power transistor 202, reference transistor 208, and sense transistor 210 are driven by a common gate control signal ($g_1$), such that these three transistors simultaneously switch between their respective conductive states and non-conductive states. Control circuitry 212 is electrically coupled to each of power transistor 202, reference transistor 208, and sense transistor 210, and control circuitry 212 is configured to generate an output signal 216 representing magnitude of current $I_L$ through power transistor 202. Although control circuitry 212 is illustrated as a single element for illustrative simplicity, control circuitry 212 may include multiple elements without departing from the scope hereof. Additionally, while control circuitry 212 is illustrated as being electrically coupled to source (S) of each of power transistor 202, reference transistor 208, and sense transistor 210, as well to drain (D) of each of reference transistor 208 and sense transistor 210, connections between control circuitry 212 and the remainder of electrical circuit 200 could vary without departing from the scope hereof.

Control circuitry 212 is configured to control magnitude of current $I_{sense}$ through sense transistor 210 such that a voltage at sense transistor 210 has a predetermined relationship to, e.g., is substantially equal to or predetermined multiple of, a voltage at power transistor 202. In this document, "substantially equal to" means equal within plus or minus ten percent. For example, in some embodiments, control circuitry 212 is configured to control magnitude of current $I_{sense}$ through sense transistor 210 such that a drain-to-source voltage at sense transistor 210 has a predetermined relationship to a drain-to-source voltage at power transistor 202. As another example, in some other embodiments, control circuitry 212 is configured to control magnitude of current $I_{sense}$ through sense transistor 210 such that a voltage $V_{sense}$ at source S of sense transistor 210 has a predetermined relationship to a voltage $V_{pwr}$ at source S of power transistor 202. In these particular embodiments, control circuitry 212 is configured to determine each of $V_{sense}$, $V_{pwr}$, and $I_{sense}$, and control circuitry 212 is further configured to determine $I_L$ using the following equation, or a variation thereof:

$$I_L = \frac{V_{drain}}{R_{pwr}}\left(1 - \frac{1}{N}\right) + I_{sense}\frac{R_{sense}}{NR_{pwr}} \quad \text{(EQN. 2)}$$

In EQN. 2, $V_{drain}$ is voltage at drain D of each of power and sense transistors 202 and 210, and N is a ratio of $V_{sense}$ to $V_{pwr}$. For example, in embodiments where control circuitry 212 is configured to control magnitude of current $I_{sense}$ such that voltage $V_{sense}$ is substantially equal to voltage $V_{pwr}$, N is equal to one, and in embodiments where control circuitry 212 is configured to control magnitude of current $I_{sense}$ such that voltage $V_{sense}$ is twice voltage $V_{pwr}$, N is equal to two.

Reference transistor 208 is electrically coupled in parallel with power transistor 202 via diode device 214, and reference transistor 208 is therefore subject to essentially the same operating voltage stress as power transistor 202. Consequently, reference transistor 208 ages in a manner similar to that of power transistor 202. Control circuitry 212 is configured to calibrate current $I_{sense}$ through sense transistor 210 according to one or more operating conditions at reference transistor 208.

For example, in some embodiments, control circuitry 212 is configured to calibrate current $I_{sense}$ through sense transistor 210 according to voltage at reference transistor 208, to compensate for aging of power transistor 202. In certain of these embodiments, control circuitry 212 is configured to calibrate sense transistor 210 as follows. First, control circuitry 212 determines drain-to-source voltage $V_{ds\_ref}$ at reference transistor 208 while driving current $I_{ref}$ through reference transistor 208. Control circuitry 212 then adjusts magnitude of current $I_{sense}$ according to drain-to-source voltage $V_{ds\_ref}$ to compensate for aging of power transistor 202. For example, in a particular embodiment, control circuitry 212 is configured to determine a correction factor $\Delta i$ using EQN. 3 below, and control circuitry 212 then increases magnitude of current $I_{sense}$ by correction factor $\Delta i$ to calibrate sense transistor 210. $V_{ds\_sense}$ in EQN. 3 is drain-to-source voltage at sense transistor 210.

$$\Delta i = \left[ \left( \frac{V_{ds\_ref}}{V_{ds\_sensse}} \right) \left( \frac{I_{sense}}{I_{ref}} \right) - 1 \right] I_{sense} \quad \text{(EQN. 3)}$$

In some other embodiments, control circuitry 212 is configured to calibrate current $I_{sense}$ through sense transistor 210 according to current $I_{ref}$ through reference transistor 208, to compensate for aging of power transistor 202. In certain of these embodiments, control circuitry 212 is configured to calibrate sense transistor 210 as follows. First, control circuitry 212 determines current $I_{ref}$ through reference transistor 208 while driving a drain-to-source voltage $V_{ds\_ref}$ across reference transistor 208. Control circuitry 212 then adjusts magnitude of current $I_{sense}$ according to current $I_{ref}$ to compensate for aging of power transistor 202. For example, in a particular embodiment, control circuitry 212 is configured to determine a correction factor $\Delta i$ using EQN. 3 above, and control circuitry 212 then increases magnitude of current $I_{sense}$ by correction factor $\Delta i$ to calibrate sense transistor 210.

In certain embodiments, control circuitry 212 calibrates current $I_{sense}$ on a periodic basis, such as after expiration of a predetermined time duration or after a predetermined number of switching cycles of power transistor 202. In some other embodiments, control circuitry 212 calibrates current $I_{sense}$ in response to a change in operating condition of electrical circuit 200. Examples of such change in operating condition include, but are not limited to, start-up of electrical circuit 200, shut-down of electrical circuit 200, magnitude of current k crossing a threshold value, and voltage $V_{pwr}$ crossing a threshold value.

Figure 3:
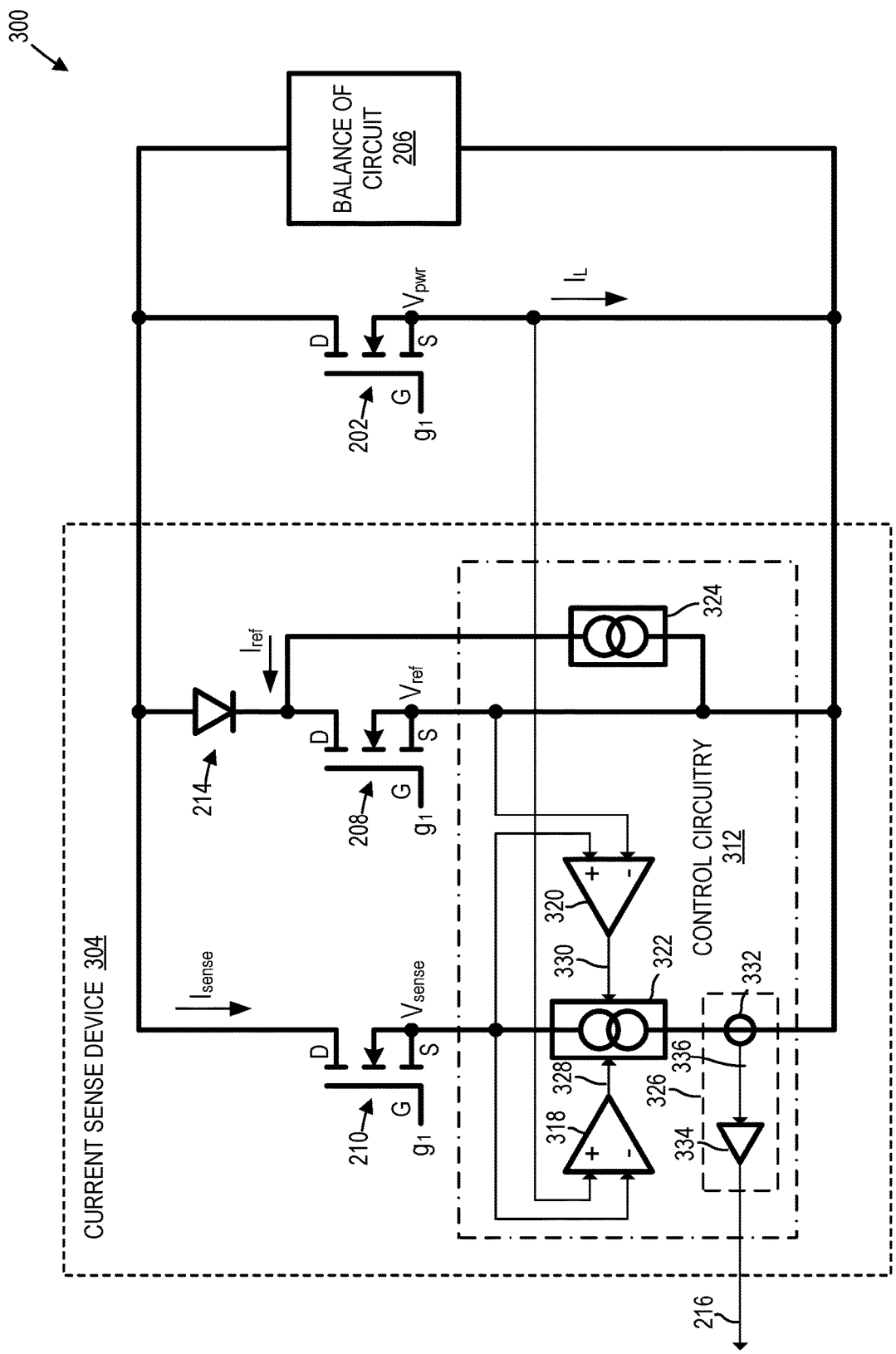
FIG. 3 illustrates an electrical circuit including an embodiment of the FIG. 2 current sense device, according to an embodiment.

FIG. 3 illustrates an electrical circuit 300 including a current sense device 304 with control circuitry 312, where current sense device 304 and control circuitry 312 are embodiments of current sense device 204 and control circuitry 212, respectively. Control circuitry 312 includes a first differential amplifier 318, a second differential amplifier 320, first current control circuitry 322, second current control circuitry 324, and output circuitry 326. First differential amplifier 318 generates a first difference signal 328 representing a difference between voltage $V_{sense}$ and voltage $V_{pwr}$, and second differential amplifier 320 generates a second difference signal 330 representing a difference between voltage $V_{sense}$ and voltage $V_{ref}$. First current control circuitry 322 is electrically coupled in series with sense transistor 210 and controls magnitude of current $I_{sense}$ based at least in part on first and second difference signals 328 and 330. In particular, first current control circuitry 322 controls magnitude of current $I_{sense}$ such that voltage $V_{sense}$ has a predetermined relationship to, e.g., is substantially equal to or is a predetermined multiple of, voltage $V_{pwr}$, as discussed above with respect to FIG. 2. Additionally, first current control circuitry 322 controls magnitude of current $I_{sense}$ by increasing magnitude of current $I_{sense}$ by a correction factor, such as correction factor $\Delta i$ of EQN. 3 above, to compensate for aging of power transistor 202. Second current control circuitry 324 drives current $I_{ref}$ through reference transistor 208, such as when power transistor 202 is in its non-conductive state, and in some embodiments, second current control circuitry 324 is configured such that magnitude of current $I_{ref}$ is substantially equal to magnitude of current $I_{sense}$.

Output circuitry 326 is configured to generate output signal 216, representing magnitude of current $I_L$, based at least in part on magnitude of current $I_{sense}$, such as using EQN. 2 above. Output circuitry 326 includes current sensing circuitry 332 and buffer circuitry 334. Current sensing circuitry 332 generates a signal 336 representing magnitude of current $I_{sense}$, and buffer circuitry 334 buffers signal 336 to generate output signal 216. Buffer circuitry 334 optionally includes a digital to analog converter (not shown) to convert signal 336 from analog to digital form, such that output signal 216 is a digital signal.

Figure 4:
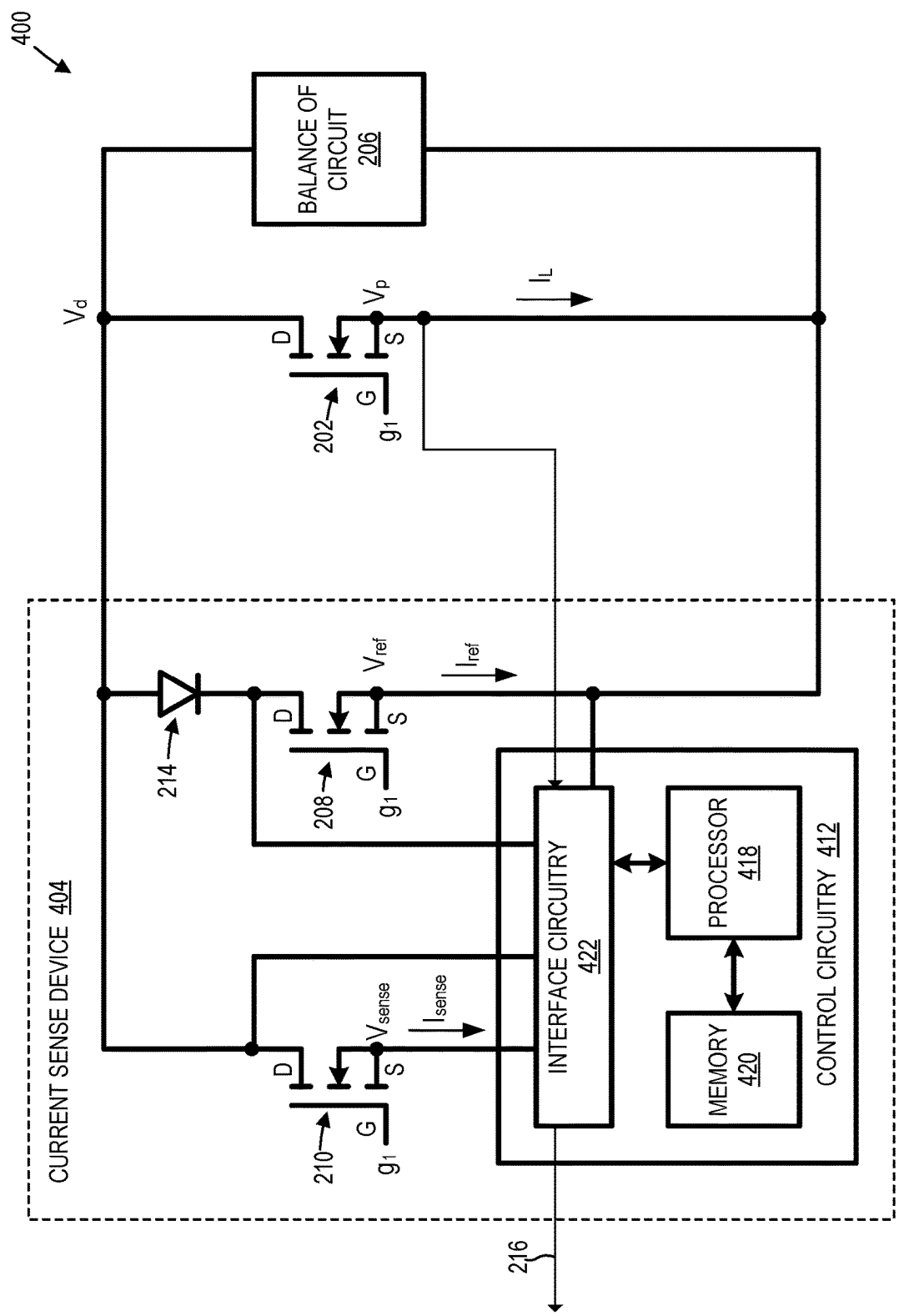
FIG. 4 illustrates an electrical circuit including another embodiment of the FIG. 2 current sense device, according to an embodiment.

FIG. 4 illustrates an electrical circuit 400 including a current sense device 404 with control circuitry 412, where current sense device 404 and control circuitry 412 are embodiments of current sense device 204 and control circuitry 212, respectively. Control circuitry 412 includes a processor 418, a memory 420, and interface circuitry 422. Interface circuitry 422 electrically interfaces processor 418 with electrical circuit 400, and in some embodiments, interface circuitry 422 includes level shifting circuitry and conversion circuitry for converting signals between analog and digital form. Processor 418 is communicatively coupled to each of interface circuitry 422 and memory 420, and processor 418 executes instructions stored in memory 420 to generate output signal 216 representing magnitude of current $I_L$ through power transistor 202 using one or more of the techniques discussed above with respect to FIG. 2. For example, in some embodiments, processor 418 executes the instructions to (a) control magnitude of current $I_{sense}$ such that voltage $V_{sense}$ has a predetermined relationship to voltage $V_{pwr}$, (b) determine magnitude of correction factor $\Delta i$ using EQN. 3 above, (c) increase magnitude of current $I_{sense}$ by correction factor $\Delta i$ to compensate for aging of power transistor 202, and (d) determine magnitude of current $I_L$ using EQN. 2 above.

It should be appreciated that the configuration of control circuitry 212 is not limited to the embodiments of FIGS. 3 and 4. Instead, control circuitry 212 can have any configuration as long as it is capable of determining magnitude of current $I_L$ and calibrating current $I_{sense}$ according to one or more operating conditions at reference transistor 208 to compensate for aging of power transistor 202.

Figure 5:
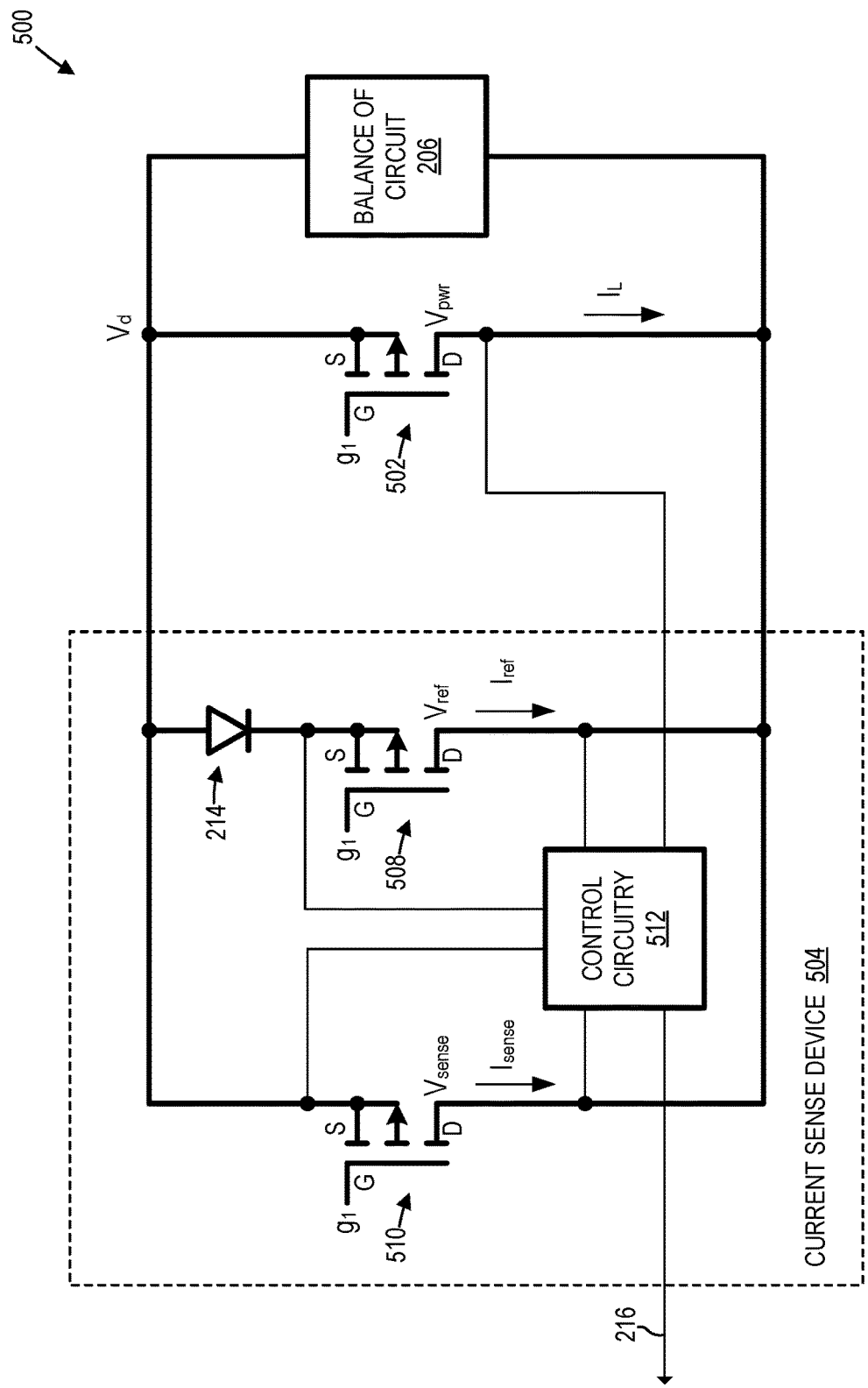
FIG. 5 illustrates an electrical circuit including a current sense device and p-channel transistors, according to an embodiment.

Although electrical circuits 200, 300, and 400 are illustrated with power transistor 202, reference transistor 208, and sense transistor 210 being n-type, enhancement-mode, metal oxide semiconductor field effect transistors (MOSFETs), the current sense devices disclosed herein not limited to this type of transistor. To the contrary, the current sense devices could be modified for use with other types of transistors, including but not limited to depletion-mode MOSFETs, p-type MOSFETs, or bipolar junction transistors (BJTs), without departing from the scope hereof. For example, FIG. 5 illustrates an electrical circuit 500, which is like electrical circuit 200 except that (a) n-type power transistor 202 is replaced with p-type power transistor 502, and (b) current sense device 204 is replaced with current sense device 504. Current sense device 504 is the same as current sense device 204 except that (a) n-type reference transistor 208 and n-type sense transistor 210 are replaced with p-type reference transistor 508 and p-type sense transistor 510, respectively, and (b) control circuitry 212 is replaced with control circuitry 512. Control circuitry 512 performs the same functions as control circuitry 212, but control circuitry 512 is adapted for use with p-channel transistors instead of for use with n-channel transistors.

Figure 6:
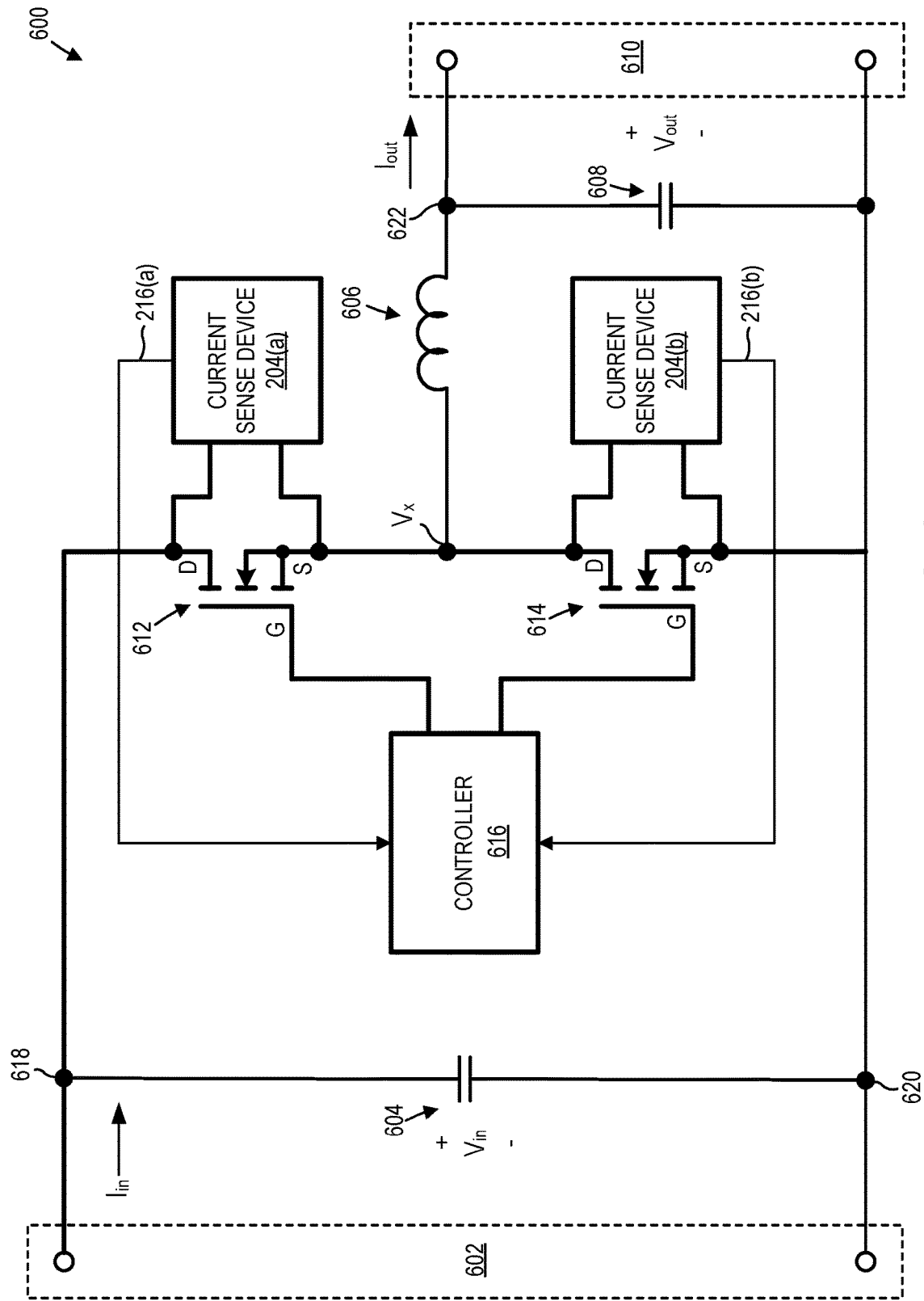
FIG. 6 illustrates a buck converter including two instances of the FIG. 2 current sense device, according to an embodiment.

One possible application of the current sense devices disclosed herein is in a switching power converter. For example, FIG. 6 illustrates a buck converter 600 including two instances of current sense device 204, hereinafter referred to as current sense device 204(a) and current sense device 204(b). Details of current sense devices 204(a) and 204(b) are not shown in FIG. 6 to promote illustrative clarity. Buck converter 600 further includes an input port 602 electrically coupled to an input power source (not shown), an input capacitor 604, an inductor 606, an output capacitor 608, an output port 610 electrically coupled to a load (not shown), a first transistor 612, a second transistor 614, and a controller 616.

Input port 602 is electrically coupled across a positive input node 618 and a reference node 620. Input capacitor 604 is electrically coupled across positive input node 618 and reference node 620, and input capacitor 604 provides a path for input ripple current drawn by buck converter 600. Drain D of first transistor 612 is electrically coupled to positive input node 618, and source S of first transistor 612 is electrically coupled to a switching node $V_x$. Gate G of first transistor 612 is electrically coupled to controller 616. Drain D of second transistor 614 is electrically coupled to switching node $V_x$, and source S of second transistor 614 is electrically coupled to reference node 620. Gate G of second transistor 614 is electrically coupled to controller 616. Inductor 606 is electrically coupled between switching node $V_x$ and a positive output node 622, and output port 610 is electrically coupled across positive output node 622 and reference node 620. Output capacitor 608 is electrically coupled across positive output node 622 and reference node 620, and output capacitor 608 provides a path for output ripple current generated by buck converter 600.

Controller 616 controls switching of first and second transistors 612 and 614 to transfer power from the power source (electrically coupled to input port 602) to the load (electrically coupled to output port 610). In particular, controller 616 controls first transistor 612 to repeatedly switch between its conductive and non-conductive states. Controller 616 also controls second transistor 614 to repeatedly switch between its conductive and non-conductive states. Controller 616 controls switching of second transistor 614 such that it performs a freewheeling function, or in other words, such that second transistor 614 provides a path for current flowing through inductor 606 when first transistor 612 is in its non-conductive state. In some embodiments, controller 616 controls switching of first and second transistors 612 and 614 to regulate one or more parameters of buck converter 600, such as input voltage $V_{in}$, input current $I_{in}$, input power $P_{in}$, output voltage $V_{out}$, output current $I_{out}$, and output power $P_{out}$.

Current sense device 204(a) generates an output signal 216(a) representing magnitude of current through first transistor 612, and current sense device 204(b) generates an output signal 216(b) representing magnitude of current through second transistor 614. Accordingly, each of first transistor 612 and second transistor 614 is analogous to power transistor 202 of FIGS. 2-4. Controller 616 receives each of output signals 216(a) and 216(b), and controller 616 uses output signals 216(a) and 216(b) to achieve one or more of over-current protection, current-mode control, power monitoring, and load-dependent voltage positioning of buck converter 600.

It should be appreciated that the current sense devices discussed above are not limited to use in a buck converter, or even to use in a switching power converter. Instead, the current sense devices could be used in many other applications to sense magnitude of current through a transistor.

Figure 7:
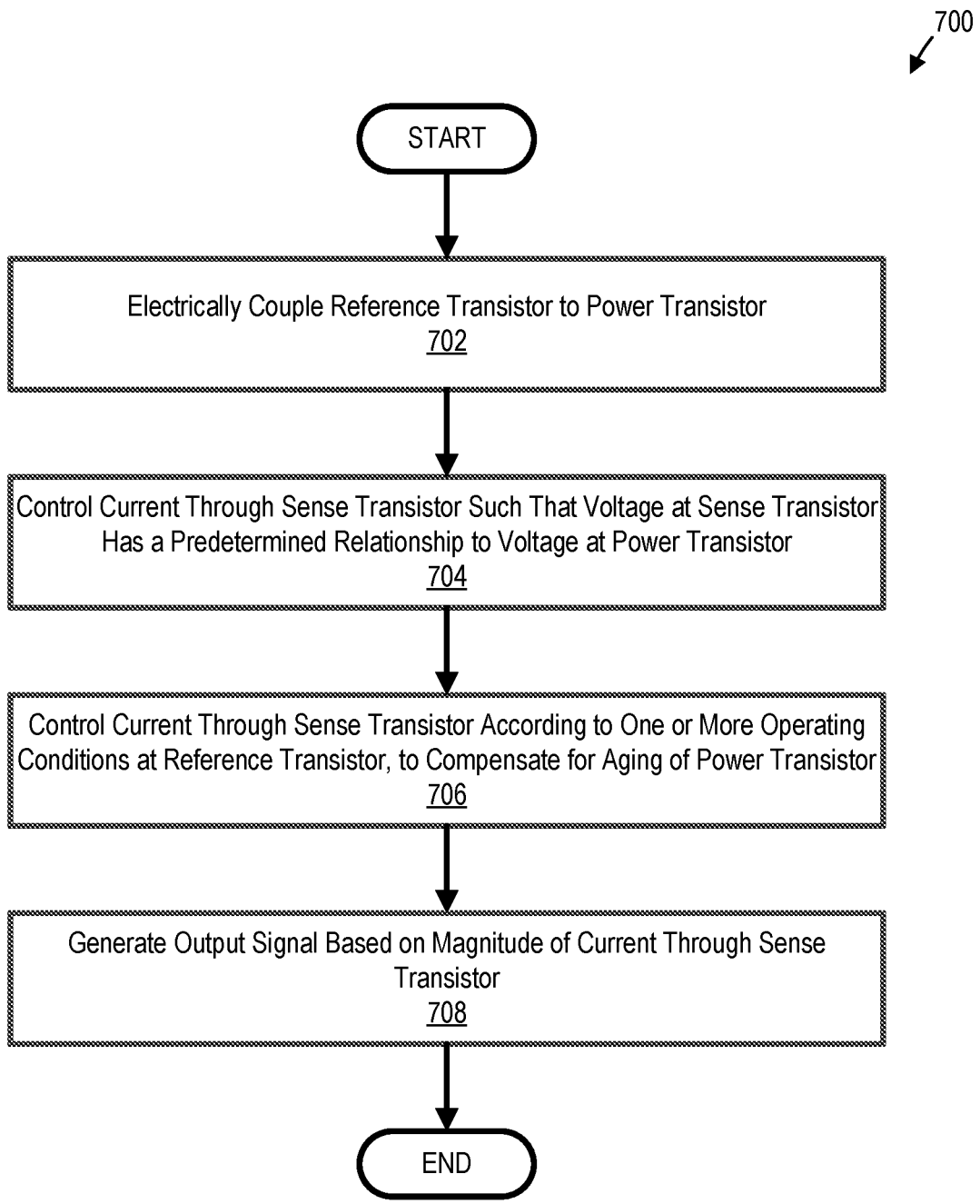
FIG. 7 illustrates a method for sensing magnitude of current through a power transistor, according to an embodiment.

FIG. 7 illustrates a method 700 for sensing magnitude of current through a power transistor. In step 702, a reference transistor is electrically coupled to the power transistor at least during switching of the power transistor. In one example of step 702, reference transistor 208 is electrically coupled to power transistor 202 via diode device 214 (FIGS. 2-4). In another example of step 702, reference transistor 508 is electrically coupled to power transistor 502 via diode device 214 (FIG. 5). In step 704, current through the sense transistor is controlled such that a voltage at the sense transistor has a predetermined relationship to a voltage at the power transistor. In one example of step 704, control circuitry 212 controls magnitude of current through sense transistor 210 such that voltage $V_{sense}$ is substantially equal to, or a multiple of, voltage $V_{ref}$.

In step 706, current through the sense transistor is controlled according to one or more operating conditions at the reference transistor, to compensate for aging of the power transistor. In one example of step 706, control circuitry 212 increases magnitude of current $I_s$ by correction factor $\Delta i$, determined from voltage $V_{ref}$, or from current $I_{ref}$, using EQN. 3, to compensate for aging of power transistor 202. In step 708, an output signal representing magnitude of current through the power transistor is generated based on magnitude of current through the sense transistor. In one example of step 708, control circuitry 212 generates output signal 216 based on magnitude of current $I_s$.

Combinations of Features

Features described above may be combined in various ways without departing from the scope hereof. The following examples illustrate some possible combinations:

In a first aspect, a method for sensing magnitude of current through a power transistor includes (a) electrically coupling a reference transistor to the power transistor at least during switching of the power transistor, (b) controlling current through a sense transistor such that a voltage at the sense transistor has a predetermined relationship to a voltage at the power transistor, (c) controlling current through the sense transistor according to one or more operating conditions at the reference transistor, to compensate for aging of the power transistor, and (d) generating an output signal based on magnitude of current through the sense transistor, the output signal representing magnitude of current through the power transistor.

In some embodiments of the first aspect, the step of electrically coupling the reference transistor to the power transistor at least during switching of the power transistor includes electrically coupling the reference transistor in parallel with the power transistor via a diode device.

In some embodiments of the first aspect, the step of controlling current through the sense transistor such that the voltage at the sense transistor has the predetermined relationship to the voltage at the power transistor includes controlling current through the sense transistor such that the voltage at the sense transistor is substantially equal to the voltage at the power transistor.

In some embodiments of the first aspect, the step of controlling current through the sense transistor according to the one or more operating conditions at the reference transistor includes increasing magnitude of current through the sense transistor by a correction factor.

In some embodiments of the first aspect, the one or more operating conditions at the reference transistor include voltage at the reference transistor.

In some embodiments of the first aspect, the one or more operating conditions at the reference transistor include current through the reference transistor.

Some embodiments of the first aspect further include causing each of the power transistor, the reference transistor, and the sense transistor to simultaneously switch between respective conductive states and respective non-conductive states.

In some embodiments of the first aspect, the step of controlling current through the sense transistor according to the one or more operating conditions at the reference transistor is performed periodically.

In some embodiments of the first aspect, the step of controlling current through the sense transistor according to the one or more operating conditions at the reference transistor is performed in response to a change in operating condition of an electrical circuit including the power transistor.

In a second aspect, a current sense device includes (a) a reference transistor for electrically coupling to a power transistor, (b) a sense transistor for electrically coupling to the power transistor, and (c) control circuitry configured to (1) control current through the sense transistor such that a voltage at the sense transistor has a predetermined relationship to a voltage at the power transistor, and (2) control current through the sense transistor according to one or more operating conditions at the reference transistor, to compensate for aging of the power transistor.

Some embodiments of the second aspect further include a diode device for electrically coupling between the reference transistor and the power transistor, such that the reference transistor is electrically coupled in parallel with the power transistor via the diode device.

In some embodiments of the second aspect, the control circuitry is further configured to control current through the sense transistor such that the voltage at the sense transistor is substantially equal to the voltage at the power transistor.

In some embodiments of the second aspect, the control circuitry is further configured to increase magnitude of current through the sense transistor by a correction factor, to compensate for aging of the power transistor.

In some embodiments of the second aspect, an on-resistance of the sense transistor has a predetermined relationship to an on-resistance of the power transistor.

In some embodiments of the second aspect, the on-resistance of the sense transistor has a predetermined relationship to an on-resistance of the reference transistor.

In some embodiments of the second aspect, the one or more operating conditions at the reference transistor comprise current through the reference transistor.

In some embodiments of the second aspect, the one or more operating conditions at the reference transistor comprise voltage at the reference transistor.

In some embodiments of the second aspect, the control circuitry includes (a) a first differential amplifier configured to generate a first difference signal representing a difference between the voltage at the power transistor and the voltage at the sense transistor, (b) a second differential amplifier configured to generate a second difference signal representing a difference between the voltage at the reference transistor and the voltage at the sense transistor, and (c) current control circuitry configured to control magnitude of current through the sense transistor based at least in part on the first and second difference signals.

Some embodiments of the second aspect further include output circuitry configured to generate an output signal based at least partially on magnitude of current through the sense transistor, the output signal representing magnitude of current through the power transistor.

In some embodiments of the second aspect, each of the reference transistor and the sense transistor is a metal oxide semiconductor field effect transistor.

In a third aspect, an electrical circuit includes a power transistor and a current sense device including (a) a reference transistor electrically coupled to the power transistor, (b) a sense transistor electrically coupled to the power transistor, and (c) control circuitry configured to (1) control current through the sense transistor such that a voltage at the sense transistor has a predetermined relationship to a voltage at the power transistor and (2) control current through the sense transistor according to one or more operating conditions at the reference transistor, to compensate for aging of the power transistor.

In some embodiments of the third aspect, the current sense device further includes a diode device electrically coupled between the reference transistor and the power transistor, such that the reference transistor is electrically coupled in parallel with the power transistor via the diode device.

In some embodiments of the third aspect, the control circuitry is further configured to control current through the sense transistor such that the voltage at the sense transistor is substantially equal to the voltage at the power transistor.

In some embodiments of the third aspect, the control circuitry is further configured to increase magnitude of current through the sense transistors by a correction factor, to compensate for aging of the power transistor.

In some embodiments of the third aspect, an on-resistance of the sense transistor has a predetermined relationship to an on-resistance of the power transistor.

In some embodiments of the third aspect, the on-resistance of the sense transistor has a predetermined relationship to an on-resistance of the reference transistor.

In some embodiments of the third aspect, the one or more operating conditions at the reference transistor comprise at least one of voltage at the reference transistor and current through the reference transistor.

Some embodiments of the third aspect further include output circuitry configured to generate an output signal based at least partially on magnitude of current through the sense transistor, the output signal representing magnitude of current through the power transistor.

In some embodiments of the third aspect, each of the reference transistor and the sense transistor is a metal oxide semiconductor field effect transistor.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A method for sensing magnitude of current through a power transistor, comprising:
    electrically coupling a reference transistor in parallel with the power transistor at least during switching of the power transistor;
    controlling current through a sense transistor such that a voltage at the sense transistor has a predetermined relationship to a voltage at the power transistor;
    controlling current through the sense transistor according to one or more operating conditions at the reference transistor, to compensate for aging of the power transistor, wherein the step of controlling current through the sense transistor according to the one or more operating conditions at the reference transistor includes increasing magnitude of current through the sense transistor by a correction factor; and generating an output signal based on magnitude of current through the sense transistor, the output signal representing magnitude of current through the power transistor.

2. The method of claim 1, wherein the step of electrically coupling the reference transistor in parallel with the power transistor at least during switching of the power transistor comprises electrically coupling the reference transistor in parallel with the power transistor via a diode device.

3. The method of claim 1, wherein the step of controlling current through the sense transistor such that the voltage at the sense transistor has the predetermined relationship to the voltage at the power transistor comprises controlling current through the sense transistor such that the voltage at the sense transistor is substantially equal to the voltage at the power transistor.

4. The method of claim 1, wherein the one or more operating conditions at the reference transistor comprise voltage at the reference transistor.

5. The method of claim 1, wherein the one or more operating conditions at the reference transistor comprise current through the reference transistor.

6. A method for sensing magnitude of current through a power transistor, comprising:
electrically coupling a reference transistor to the power transistor at least during switching of the power transistor;
controlling current through a sense transistor such that a voltage at the sense transistor has a predetermined relationship to a voltage at the power transistor;
controlling current through the sense transistor according to one or more operating conditions at the reference transistor, to compensate for aging of the power transistor;
generating an output signal based on magnitude of current through the sense transistor, the output signal representing magnitude of current through the power transistor; and
causing each of the power transistor, the reference transistor, and the sense transistor to simultaneously switch between respective conductive states and respective non-conductive states.

7. The method of claim 1, wherein the step of controlling current through the sense transistor according to the one or more operating conditions at the reference transistor is performed periodically.

8. The method of claim 1, wherein the step of controlling current through the sense transistor according to the one or more operating conditions at the reference transistor is performed in response to a change in operating condition of an electrical circuit including the power transistor.

9. A current sense device, comprising:
a reference transistor for electrically coupling to a power transistor;
a sense transistor for electrically coupling to the power transistor;
control circuitry configured to (a) control current through the sense transistor such that a voltage at the sense transistor has a predetermined relationship to a voltage at the power transistor, and (b) control current through the sense transistor according to one or more operating conditions at the reference transistor, to compensate for aging of the power transistor; and
wherein the control circuitry includes output circuitry configured to generate an output signal based at least partially on magnitude of current through the sense transistor, the output signal representing magnitude of current through the power transistor.

10. The current sense device of claim 9, further comprising a diode device for electrically coupling between the reference transistor and the power transistor, such that the reference transistor is electrically coupled in parallel with the power transistor via the diode device.

11. The current sense device of claim 9, wherein the control circuitry is further configured to control current through the sense transistor such that the voltage at the sense transistor is substantially equal to the voltage at the power transistor.

12. The current sense device of claim 9, wherein the control circuitry is further configured to increase magnitude of current through the sense transistor by a correction factor, to compensate for aging of the power transistor.

13. The current sense device of claim 9, wherein an on-resistance of the sense transistor has a predetermined relationship to an on-resistance of the power transistor.

14. The current sense device of claim 13, wherein the on-resistance of the sense transistor has a predetermined relationship to an on-resistance of the reference transistor.

15. The current sense device of claim 9, wherein the one or more operating conditions at the reference transistor comprise current through the reference transistor.

16. The current sense device of claim 9, wherein the one or more operating conditions at the reference transistor comprise voltage at the reference transistor.

17. The current sense device of claim 16, wherein the control circuitry comprises:
a first differential amplifier configured to generate a first difference signal representing a difference between the voltage at the power transistor and the voltage at the sense transistor;
a second differential amplifier configured to generate a second difference signal representing a difference between the voltage at the reference transistor and the voltage at the sense transistor; and
current control circuitry configured to control magnitude of current through the sense transistor based at least in part on the first and second difference signals.

18. The current sense device of claim 9, wherein each of the reference transistor and the sense transistor is a metal oxide semiconductor field effect transistor.

* * * * *